United States Patent
Yamamoto et al.

(10) Patent No.: US 6,837,554 B2
(45) Date of Patent: Jan. 4, 2005

(54) CABINET STRUCTURE OF ELECTRONIC DEVICE

(75) Inventors: Takashi Yamamoto, Hirakata (JP); Yoshikazu Aoyagi, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 80 days.

(21) Appl. No.: 10/240,204

(22) PCT Filed: Mar. 16, 2001

(86) PCT No.: PCT/JP01/02099
§ 371 (c)(1),
(2), (4) Date: Sep. 30, 2002

(87) PCT Pub. No.: WO01/76341
PCT Pub. Date: Oct. 11, 2001

(65) Prior Publication Data
US 2003/0102786 A1 Jun. 5, 2003

(30) Foreign Application Priority Data
Mar. 31, 2000 (JP) ........................................ 2000-097491

(51) Int. Cl.[7] ................................................ H05K 7/18
(52) U.S. Cl. ................................... 312/223.2; 361/800
(58) Field of Search .............................. 312/257.1, 263, 312/223.2, 223.1, 265.5; 361/818, 800, 816; 174/66, 67, 35 R; 220/241

(56) References Cited

U.S. PATENT DOCUMENTS

| | | | |
|---|---|---|---|
| 2,133,789 A | 10/1938 | Pool | |
| 5,049,701 A | 9/1991 | Vowles et al. | |
| 5,777,854 A | 7/1998 | Welch et al. | |
| 5,814,762 A * | 9/1998 | Tusler et al. | 174/35 R |
| 6,043,992 A * | 3/2000 | Scheibler | 361/818 |
| 6,063,999 A * | 5/2000 | Kelly | 174/35 R |
| 6,141,222 A * | 10/2000 | Toor et al. | 361/726 |
| 6,194,653 B1 * | 2/2001 | McMiller et al. | 174/35 GC |
| 6,231,140 B1 * | 5/2001 | Chen | 312/223.2 |
| 6,390,320 B2 * | 5/2002 | Hurst et al. | 220/241 |
| 6,437,977 B1 * | 8/2002 | Yu | 361/685 |
| 6,621,717 B2 * | 9/2003 | Tuttle et al. | 361/818 |
| 6,685,503 B1 * | 2/2004 | Huang et al. | 439/527 |

FOREIGN PATENT DOCUMENTS

JP  3065107 U  10/1999

* cited by examiner

Primary Examiner—Janet M. Wilkens
(74) Attorney, Agent, or Firm—McDermott Will & Emery LLP

(57) ABSTRACT

A cabinet structure capable of achieving a cost reduction while reducing the number of parts and facilitating an assemblage and also capable of effectively performing an electromagnetic shielding function continuously even when an electronic part is used for long, comprising a pair of first and second platy members, the platy members further comprising the edge portions butted against each other in the state of being assembled as a cabinet, wherein the edge portion of the first platy member sets, along the longitudinal direction thereof, a plurality of contact parts coming in contact electrically with the edge portion of the second platy member in the butted state at the intervals of substantially a half or below the frequency of an electromagnetic wave.

3 Claims, 7 Drawing Sheets

F I G. 1
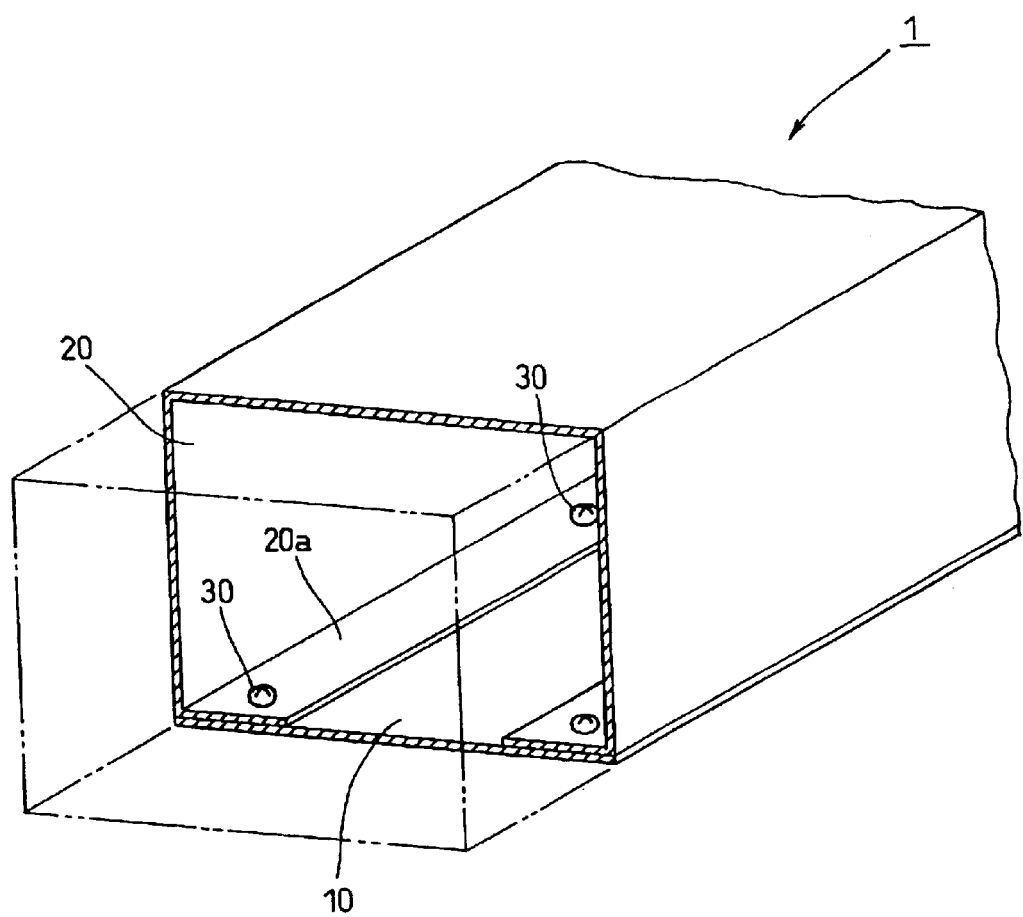

F I G. 3
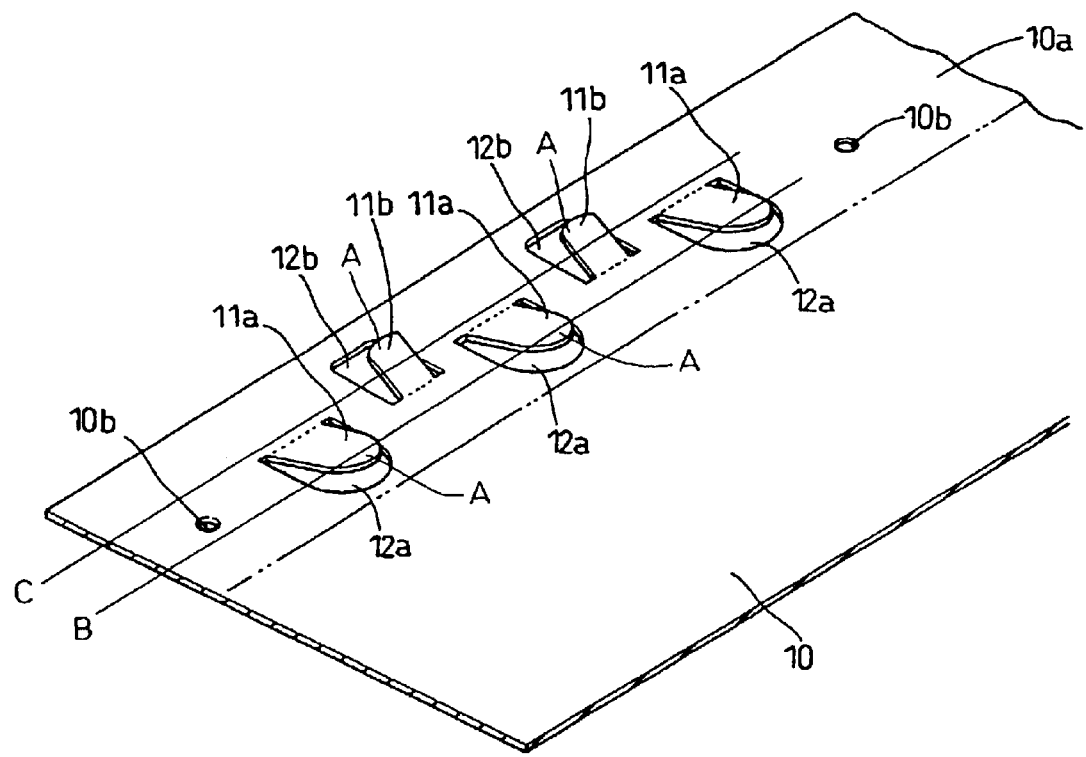

F I G. 5
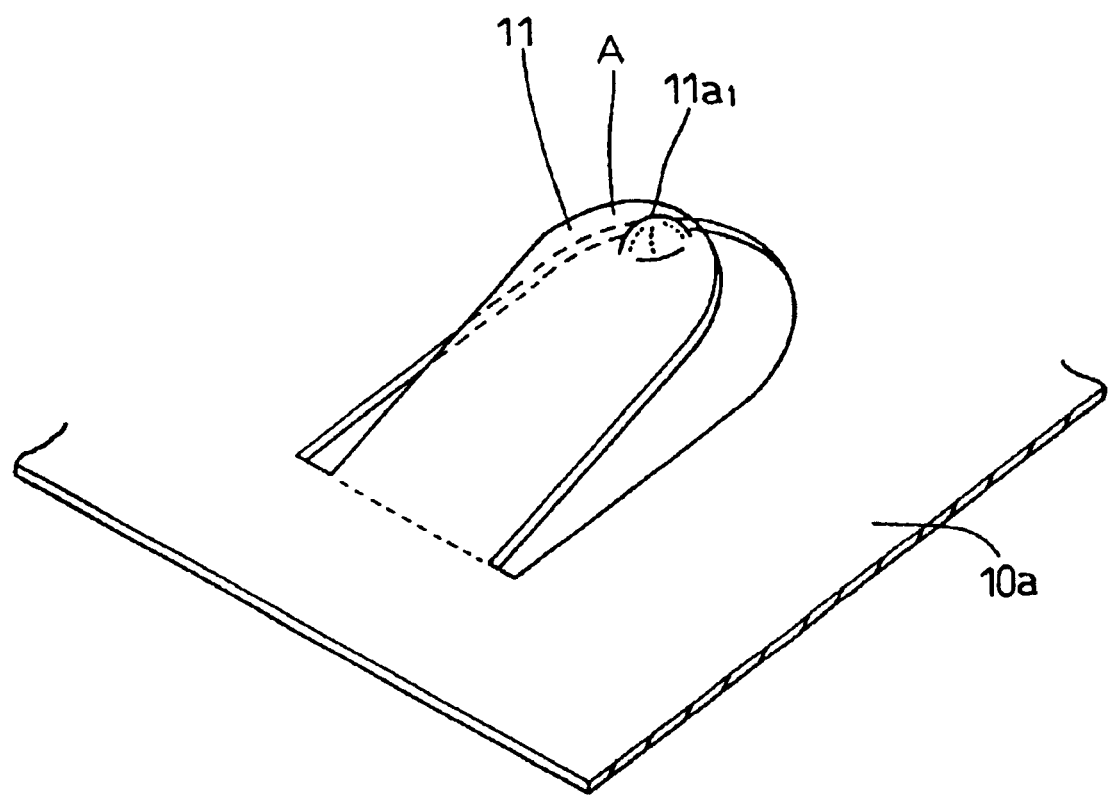

F I G. 6 A
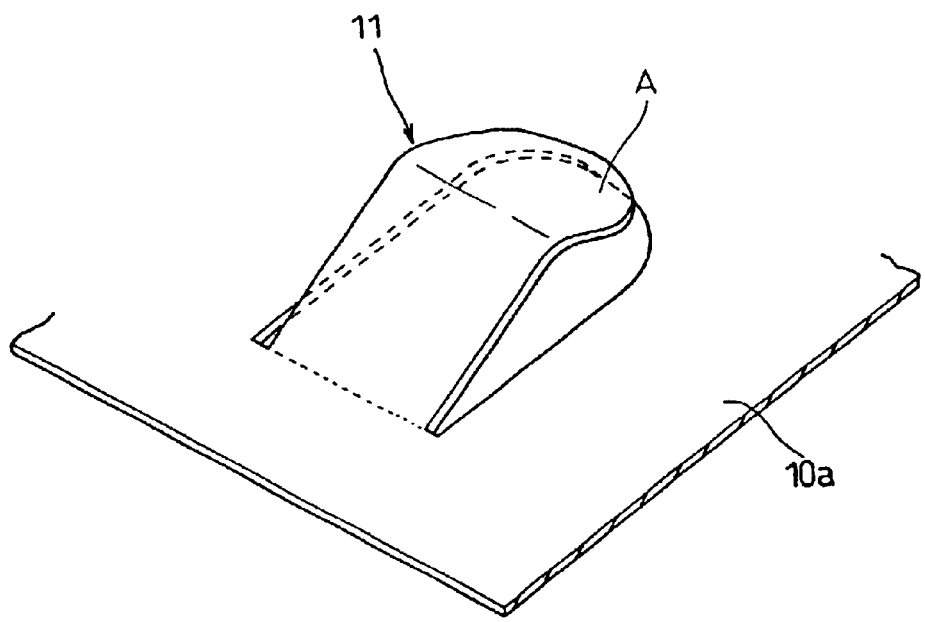
F I G. 6 B
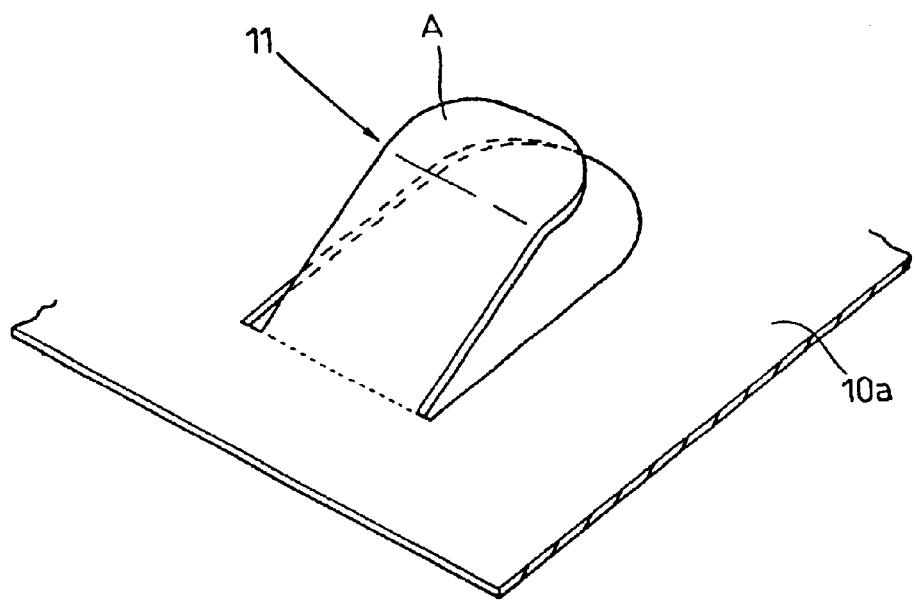

CABINET STRUCTURE OF ELECTRONIC DEVICE

FIELD OF THE INVENTION

The present invention relates to a cabinet structure of an electronic device, and more particularly, concerns a cabinet structure for shielding electromagnetic waves in the electronic device.

BACKGROUND OF THE INVENTION

In general, not only in the field of electronic devices, but also in the field of digital devices such as mobile telephones, the electromagnetic shielding technique is required for suppressing adverse effects from electromagnetic waves exerted internally as well as externally.

The cabinet structure in an electronic device is generally formed by machining a plurality of metal plate members into constituent elements of a cabinet and connecting edge portions of the plate members in the butted state through screws, etc.

In such a cabinet structure, when there is any gap in the joint between the metal plate members, electromagnetic waves, generated from electronic parts installed in the cabinet, tend to leak outside through the gap, and external electromagnetic waves tend to invade into the cabinet through the gap.

For this reason, in order to eliminate such a gap, it is necessary to machine the edge portions of the respective plate members to completely plane faces and to make the edge portions in closely contact with each other so as to be connected.

However, it is technically difficult to machine the edge portions to completely flat faces. Moreover, even when such plate faces are provided through machining, the edge portion tends to be deformed due to fastening process of screws, etc. Therefore, with respect to the cabinet, normally, the gaps tend to exist although there are variations in the degree thereof.

Here, a technique for placing electromagnetic wave shielding plates in the joints of the plate members in order to prevent invasion and leakage of electromagnetic waves to and from the cabinet has been well known.

With respect to such an electromagnetic wave shielding plate, an expensive material such as phosphor bronze is used, resulting in an increase in the material costs. Moreover, since the electromagnetic wave shielding plates are provided as separated components from the cabinet, the operation for attaching these to the above-mentioned gaps is required, resulting in an increase in the assembling costs of the cabinet.

Furthermore, due to the difference in materials of the plate members and the magnetic wave shielding plates that constitute the cabinet, a contact electrical potential difference occurs due to contact between different kinds of metals. In the case when the state having this contact electrical potential difference continues for a long time, rust portion is generated due to an oxidation-reduction reaction. This rust portion forms a portion in which the electrical conductivity of the contact between the plate members and the electromagnetic wave shielding plates is lowered, that is, an insulating portion, resulting in the same situation as the occurrence of the above-mentioned gap. As a result, there is a reduction in the electromagnetic wave shielding effects by the electromagnetic wave shielding plates.

In a cabinet structure of an electronic device, an objective of the present invention is to provide a cabinet structure which can reduce the above-mentioned costs, and also maintain the electromagnetic wave shielding function continuously for a long time.

DISCLOSURE OF THE INVENTION (1) A cabinet structure of an electronic device of the present invention is provided with a pair of first and second plate members having edge portions that are butted against each other in a combined state as a cabinet, the edge portion of the first plate member is provided with a plurality of contact portions that contact the edge portion of the second plate member in the butted state along the length direction thereof, the contact portions are formed by notches made in the edge portion of the first plate member so as to have a spring property, with a curved portion being formed on an idle end side thereof, and the above-mentioned contact portions are classified into the first group having the idle end directed toward the inside of the cabinet and the second group having the idle end directed toward the outside of the cabinet, with the contact portions belonging to the respective two groups being alternately formed on the edge portion of the first plate member along the length direction thereof, the contact portions belonging to the first group being placed at positions closer to the edge of the cabinet than the contact portions belonging to the second group, with a size smaller than that of the contact portions belonging to the second group.

In accordance with the present invention, a plurality of contact portions are set with intervals, for example, each of which is set to virtually not more than ½ of a wave-length with respect to the frequency of electromagnetic waves so that it is possible to shield the electromagnetic waves from passing through the interval between the adjacent contact portions. In other words, the interval surrounded by conductors is allowed to have an antenna function. The electromagnetic waves have properties of waves, and come to resonate in a conductor that electrically has a ½ of the waveform thereof. Here, the half-wavelength antenna has high directivity. Therefore, when a plurality of the contact portions are set with intervals each of which is set to virtually not more than ½ of a wave-length with respect to the frequency of electromagnetic waves, it becomes possible to desirably shield the transmission of the electromagnetic waves through the interval.

Moreover, in the present invention, since the contact portions are integrally formed together with the plate-shaped members, it is possible to eliminate the necessity of conventional electromagnetic wave shielding plates to be placed separately from the cabinet; therefore, it becomes possible to reduce the number of parts, and consequently to reduce the costs.

Furthermore, in the case of the present invention, it is possible to provide the contact portions by using the same material as the plate members so that it becomes possible to further reduce the costs in comparison with the conventional electromagnetic shielding plates made of phosphor bronze.

In the case of the present invention, since the above-mentioned contact portions are integrally formed together with the plate members, it is possible to provide better operability upon assembling these into a cabinet.

Moreover, in the case of the present invention, since the above-mentioned contact portions are integrally formed together with the plate members, and since the materials thereof are consequently the same, no contact electric potential difference occurs even in the contact state to the plate members on the other side; therefore, no rust generation occurs even after a long time use, thereby making it possible to effectively maintain the electromagnetic wave shielding function continuously.

Moreover, the present invention makes it possible to desirably maintain the mechanical strength and flatness of the cabinet constituent elements, to smoothly insert the respective cabinet constituent elements, and also to keep the gap dimension the same as preliminarily set by maintaining a desirable electrical contact state to the cabinet constituent elements on the opposite side; thus, it becomes possible to positively ensure the shielding function of unnecessary radiated electromagnetic waves.

BRIEF DESCRIPTION OF THE DRAWINGS

FIG. 1 is an exploded perspective view that shows a cabinet structure in accordance with a preferred embodiment of the present invention.

FIG. 3 is an enlarged perspective view that shows an essential portion of a plate member in a cabinet structure in accordance with another preferred embodiment of the present invention.

FIG. 5 is an enlarged perspective view that shows an essential portion of a plate member in a cabinet structure in accordance with still another preferred embodiment of the present invention.

FIG. 6(*a*) is an enlarged perspective view that shows an essential portion of a plate member in a cabinet structure in accordance with still another preferred embodiment of the present invention.

FIG. 6(*b*) is an enlarged perspective view that shows an essential portion of the plate member of FIG. 6(*a*).

BEST MODES FOR CARRYING OUT THE INVENTION

Referring to attached drawings, the following description will discuss a cabinet structure of an electronic device in accordance with the most preferred embodiment of the present invention.

Figure 2:
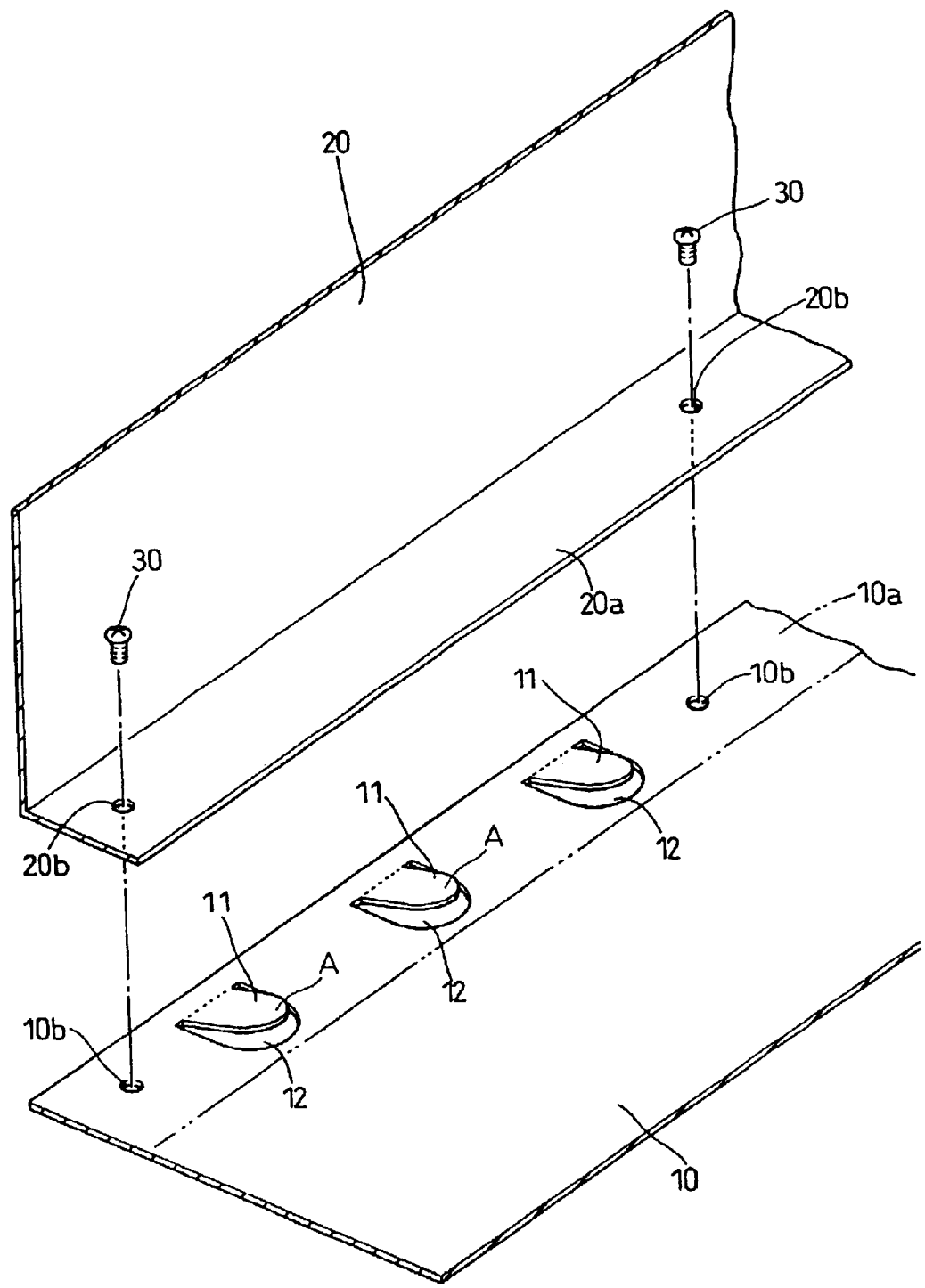
FIG. 2 is a partially exploded perspective view that shows an essential portion of FIG. 1 in an enlarged manner.

FIGS. 1 and 2 are drawings that show a cabinet structure of an electronic device in accordance with the most preferred embodiment of the present invention.

As shown in these Figures, a cabinet 1 of an electronic device of the present preferred embodiment is provided with a plurality of plate members 10, 20.

The plate members 10, 20 are respectively machined to shapes of the respective constituent elements of the cabinet, and connected to each other with the mutual edge portions 10*a*, 20*a* being connected by screws 30 in the butted state to each other.

The edge portion 20*a* of the plate member 20 is a portion that is bent with right angles, and screw insertion holes 20*b*, 20*b* are formed therein with a predetermined interval in the length direction.

The plate member 10 is provided with the edge portion 10*a* that is butted to the edge portion 20*a* of the plate member 20.

Screw engaging holes 10*b*, 10*b* are formed in the edge portion 10*a* in a manner so as to correspond to the screw insertion holes 20*b*, 20*b*.

A plurality of contact portions 11, which have a tongue-shape and are used for reducing electromagnetic waves, are integrally formed on the edge portion 10*a* of the plate member 10 in the length direction with constant intervals.

An idle end side A of each contact portion 11 is directed inward to the cabinet 1.

The contact portions 11 are formed by notches 12 having a predetermined shape, such as a U-letter shape.

The idle end side A of each contact portion 11 is allowed to stick out slightly from the surface of the edge portion 10*a*, and has a spring property.

The following description will discuss assembling processes of the plate members 10, 20.

The mutual edge portions 10*a*, 20*a* of the two plate members 10, 20 are butted to each other and superposed one on the other, and the screw insertion holes 20*b*, 20*b* and the screw engaging holes 10*b*, 20*b* are positioned, and screws 30, 30 are inserted through the screw insertion holes 20*b*, 20*b*, and engaged with the screw engaging holes 10*b*, 10*b* so that the two plate members 10, 20 are connected to each other.

In this state, the edge portion 20*a* of the plate member 20 is made in contact with the respective contact portions 11.

Thus, each contact portion 11 of the plate member 10 is pressed by the edge portion 20*a* of the plate member 20, and deformed with its spring property, and by its reactive force, each contact portion 11 is elastically made in contact with the edge portion 20*a* of the plate member 20.

In the present preferred embodiment, since the contact portions 11 are integrally formed on the edge portion 10*a*, different from a conventional cabinet, it is possible to eliminate the necessity of preparing electromagnetic wave shielding plates in a separate manner so as to shield electromagnetic waves, and consequently to reduce the number of parts.

Moreover, in the present preferred embodiment, the operation for assembling the electromagnetic wave shielding plates onto the cabinet is no longer required; therefore, it becomes possible to reduce the assembling costs.

Furthermore, different from the conventional cabinet, the present preferred embodiment does not require any expensive shielding material such as phosphor bronze, it becomes possible to reduce the material costs.

Since the same material as the cabinet constituent element can be used as the material of the electromagnetic shielding member, it is possible to reduce the costs in comparison with the case in which phosphor bronze is used for separately forming the electromagnetic wave shielding plates.

Moreover, since the contact member 11 has a spring property, it is possible to improve the electrical contact state to the edge portion 20*a*, and to accurately specify the dimension of the interval that controls the transmission of electromagnetic waves, thereby making it possible to preferably maintain the electromagnetic wave shielding property.

Here, each contact portion 11 is set to a raised state from the surface of the edge portion 10*a* by the U-letter-shaped notch 12 so that the above-mentioned spring property is preferably exerted effectively. The formation of the contact portions 11 by the use of the notches 12 is easily carried out so that it is possible to further reduce the manufacturing costs.

Moreover, in the present preferred embodiment, the plate members 10, 20 are made of the same material so that the contact portions 11 are also made of the same material as the plate members 20; therefore, no contact electric potential difference occurs between the contact portions 11 and the edge portion 20a of the plate member 20. Thus, no rust generation occurs on the contact portions 11 and the edge portion 20a even after a long time use, thereby making it possible to continuously maintain the electromagnetic wave shielding function effectively.

In the present preferred embodiment, with respect to the frequencies of electromagnetic waves to be shielded, in addition to the basic wave frequency, n-ordered higher harmonic frequency specified on the assumption that n is a natural number of not less than 2 is also included therein, and the interval between the respective contact portions 11 is set to be not more than approximately ½ of the wavelength of the frequency of an n-ordered electromagnetic wave to be shielded. In this case, the interval between the two screws 30 is set to not less than ½ of the wavelength of the frequency of an electromagnetic wave to be shielded.

With this arrangement, the cabinet structure of the present preferred embodiment makes it possible to preferably shield the transmission of electromagnetic waves through the interval by controlling the interval between the contact portions 11.

For example, suppose that the basic wave frequency of electromagnetic waves to be shielded is 1 GHz, and that the order of the higher harmonic waves to be shielded is the fifth order. The wavelength of the basic wave frequency 1 GHz is 30 cm. The wavelength of the fifth order higher harmonic wave thereof is 6 cm, and the interval between the contact portions 11 is set to not more than 3 cm that is a half or below the wavelength thereof.

In this case, the target electromagnetic waves to be shielded are the electromagnetic wave of the basic wave frequency of 1 GHz, and the electromagnetic waves of $2^{nd}$-order to $5^{th}$-order higher harmonic waves, that is, 2 GHz, 3 GHz, 4 GHz and 5 GHz.

Here, depending on conditions and situations, the interval of the electromagnetic wave shielding contact portions 11 may be set to not more than 15 cm, that is, a half or below the wavelength 30 cm of the basic frequency 1 GHz.

A gap from which the electromagnetic wave generated in the cabinet 1 is externally released is a fine gap surrounded by the edge portions 10a, 20a and the contact portions 11, 11. Since the dimension of this fine gap is set to a size capable of shielding electromagnetic waves ranging from the basic wave frequency to the fifth-order higher harmonic wave frequency as described above, external leakage of such electromagnetic waves is prevented.

Moreover, invasion of electromagnetic waves from the external space to the inside of the cabinet through the gap is also prevented.

The above explanation has dealt with higher-order higher harmonic waves; however, upon dealing with mutual modulation, the corresponding processes are explained as follows: When a plurality of different single of frequencies coexist, a mutual modulation occurs.

For example, supposing that frequencies of two signals are f1, f2, in addition to components of frequencies f1, f2, direct current components and components of frequencies f1–f2, 2f1, 2f2, f1+f2 are generated due to $2^{nd}$-order non-linear characteristics. Moreover, components of frequencies 2f1–f2, 2f2–f1, 3f1, 3f2, 2f1+f2, f1+2f2 are generated due to $3^{rd}$-order non-linear characteristics. Further higher-order frequency components are also generated.

In general, supposing that m, n are integers, components of frequencies, mf1±nf2, are generated. When there are not less than three kinds of frequencies, the situation becomes more complicated.

For example, when there are a plurality of clock generation sources for circuits inside an electronic device sometimes raise a problem. For example, supposing that clocks of 1.5 GHz and 1 GHz coexist, those higher frequencies of 2nd-order components include 2f1=3 GHz, 2f2=2 GHz, f1+f2=2.5 GHz. Moreover, those higher frequencies of $3^{rd}$-order components include 3f1=4.5 GHz, 2f1+f2=4 GHz, f1+2f2=3.5 GHz. Further higher-order frequency components, for example, 5 GHz, 5.5 GHz, 6 GHz, 6.5 GHz, 7.5 GHz, etc. are also generated. Here, for example, when m=4, n=4, the maximum frequency is 10 GHz. When m=8, n=8, the maximum frequency is 20 GHz. In the case of 10 GHz, the wavelength is 3 cm, and in order to shield electromagnetic waves of this frequency, the interval between the contact portions 11 is set to not more than 1.5 cm, that is, a half of 3 cm. In the case of 20 GHz, the interval between the contact portions 11 is set to not more than 0.75 cm.

Whether the higher-order higher harmonic waves or the mutual modulation is dealt with, in general, in order to provide EMC (ElectroMagnetic Compatibility) to an electromagnetic wave of a frequency fk, the interval of the contact portions 11 is set in the following manner:

Supposing that the velocity of light in vacuum is c, the relationship between the frequency fk and the wavelength λ is represented by:

fk·λ=c=3×1010 (cm); therefore, by setting the interval of the contact portions 11 to not more than λ/2 with ½ of the wavelength λ being set as, λ/2=(3×1010)/(2×fk) (cm), it becomes possible to effectively shield the emission of the electromagnetic wave of the target frequency fk for providing EMC, and also to improve immunity effectively.

Another preferred embodiment (1) Referring to FIG. 3, the following description will discuss another preferred embodiment of the present invention.

A plurality of contact portions 11a belonging to the first group are placed on the edge portion 10a of the plate member 10 in the length direction by forming notches 12a.

A plurality of contact portions 11b belonging to the second group are placed between the respective contact portions 11a of the first group by forming notches 12b The idle end side A of each contact portion 11a of the first group is directed toward the inside of the cabinet, while the idle end side A of each contact portion 11b of the second group is directed to the outside of the cabinet.

With respect to the aligned line B in the length direction of the contact portions 11a of the first group, the aligned line C in the length direction of the contact portions 11b of the second group is placed at a position closer to the outside of the cabinet 1.

Each contact portion 11a of the first group is formed so as to be smaller than each contact portion 11b of the second group.

In this preferred embodiment, since the idle end side of each contact portion 11a of the first group is set in a direction different from the idle end side of each contact portion 11b of the second group so that it is possible to desirably maintain the mechanical strength and flatness of the cabinet constituent elements, and also to insert the cabinet constituent elements smoothly. Moreover, since, with respect to the contact portions 11a of the first group, the contact portions 11b of the second group are placed at positions closer to the outside of the cabinet 1, it is possible to desirably maintain the mechanical strength and flatness of the cabinet constituent elements, and it is also possible to keep the gap dimension the same as preliminarily set by maintaining a desirable electrical contact state to the cabinet constituent elements on the opposite side. Moreover, since each contact portion 11a of the first group is formed to be smaller than each contact portion 11b of the second group, it is possible to desirably maintain the mechanical strength and flatness of the cabinet constituent elements, and it is also possible to keep the gap dimension the same as preliminarily set by maintaining a desirable electrical contact state to the cabinet constituent elements on the opposite side. In this manner, the combination of the above-mentioned arrangements of the respective contact portions 11a, 11b makes it possible to ensure the shielding function of unnecessary radiated electromagnetic waves.

The same functions and effects as the above-mentioned embodiment are obtained by this preferred embodiment.

Figure 4:
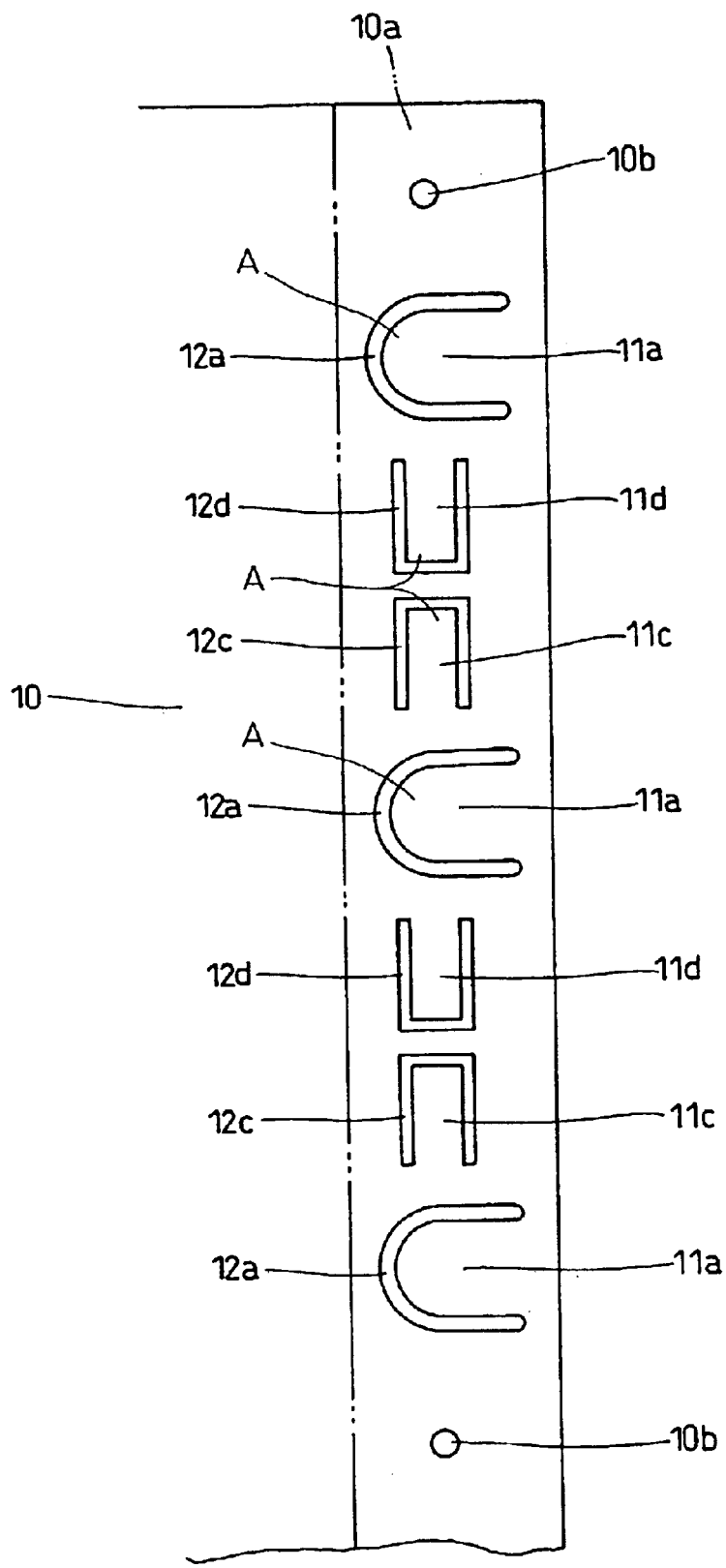
FIG. 4 is an enlarged plan view that shows an essential portion of a plate member in a cabinet structure in accordance with still another preferred embodiment of the present invention.

(2) Referring to FIG. 4, the following description will discuss still another preferred embodiment of the present invention.

A plurality of contact portions 11a belonging to the first group are integrally formed on the edge portion 10a of the plate member 10 in the length direction. A plurality of contact portions 11c belonging to the second group and a plurality of contact portions 11d belonging to a third group are formed between the respective contact portions 11a.

The contact portions 11a, 11c, 11d belonging to the respective groups are placed by forming notches 12a, 12c, 12d.

The idle end side A of each contact portion 11a of the first group is directed inward, the idle end side A of each contact portion 11c of the second group is directed in one length direction, and the idle end side A of each contact portion 11d of the third group is directed in the other length direction.

In this preferred embodiment, since the idle end sides of the respective contact portions 11a, 11c, lid are oriented in respectively different directions, it is possible to desirably maintain the mechanical strength and flatness of the cabinet constituent elements, and by maintaining desirable electrical contact state to the cabinet constituent elements on the opposite side, it possible to ensure the shielding function of unnecessary radiated electromagnetic waves.

(3) Referring to FIG. 5, the following description will discuss still another preferred embodiment of the present invention.

In this preferred embodiment, a round, small protrusion 11a1, which directly comes in contact with the edge portion 20a, is integrally formed on the idle end side of the contact portion 11. This round, small protrusion 11a1 may be formed onto the contact portions 11 by press molding, etc., or may be formed by welding separate members made of the same material thereon.

When the idle end side A of each contact portion 11 has a sharp edge, the contact against the edge portion 20a of the plate member 20 might cause separation of plating on the surface and the subsequent rust after a long time use. Therefore, the small, round protrusion 11a1 is formed so as to prevent the separation of plating and also to maintain the electromagnetic wave shielding function by the contact portions 11 for a long time.

(4) Referring to FIGS. 6(a), 6(b), the following description will discuss still another preferred embodiment of the present invention.

In this preferred embodiment, the idle end side A of each contact portion 11 is bent into a curved shape.

The idle end side A in FIG. 6(a) has a comparatively great curved angle, and is tilted with respect to the edge portion 10a of the plate member 10.

The idle end side A in FIG. 6(b) has a comparatively small curved angle, and is in parallel with the edge portion 10a of the plate member 10.

Since the idle end side A of the contact portion is curved, it is possible to prevent separation of plating for the same reasons as described above, and consequently to maintain the electromagnetic wave shielding function by the contact portions 11 for a long time.

Figure 7:
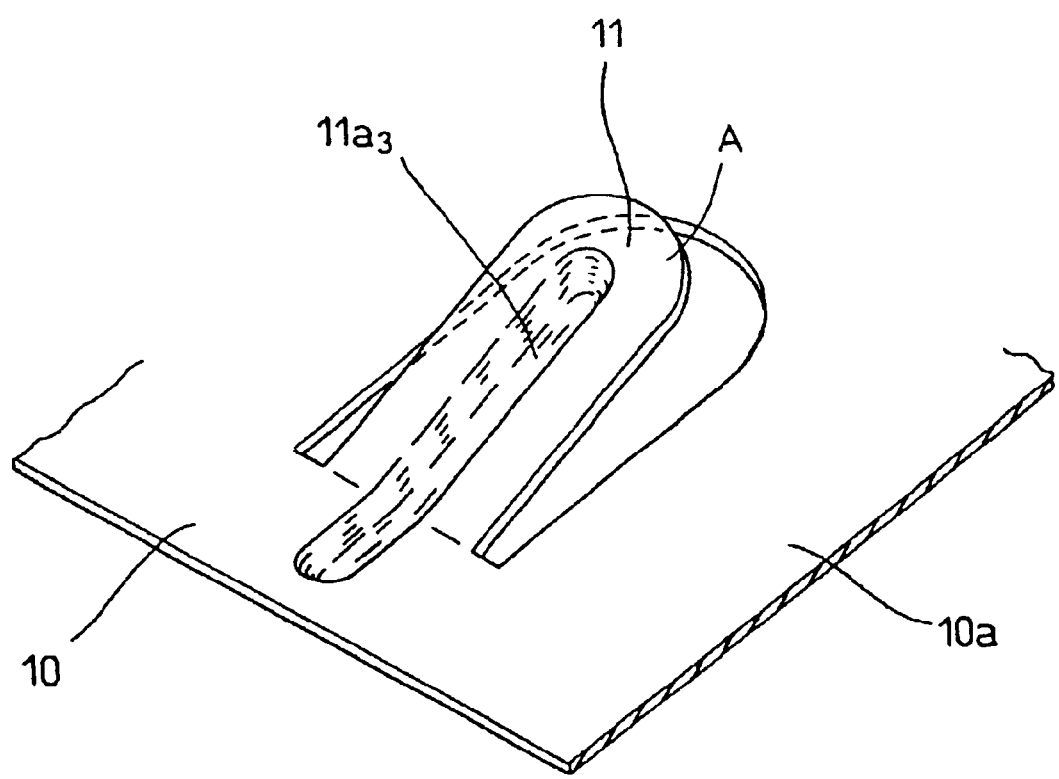
FIG. 7 is an enlarged perspective view that shows an essential portion of a plate member in a cabinet structure in accordance with still another preferred embodiment of the present invention.

(5) Referring to FIG. 7, the following description will discuss still another preferred embodiment of the present invention.

In this preferred embodiment, a stiffening rib 11a3 is integrally formed on each contact portion 11 through stamping. This stiffening rib 11a3 is formed through stamping by a press-molding process. With respect to the formation of the stiffening rib 11a3, this is preferably formed in a continuous shape from the edge portion 10a of the plate member 10 to the contact portion 11.

Here, the stiffening rib 11a3 may have either a recessed shape or a protruding shape.

Further, such a structure of the stiffening rib 11a3 may be applied to the respective preferred embodiments shown in FIGS. 5 and 6.

Here, the structures of FIGS. 5 to 7 may be applied to the contact portions 11 shown in FIGS. 1 to 4.

In general, the thickness of the plate member 10 is thin so as to reduce the weight of the cabinet. Consequently, this causes a reduction in the strength and spring property of the contact portion 11 that is integrally formed on the plate member 10. For this reason, the stiffening rib 11a3 is formed so as to maintain the strength and spring property of the contact portion 11 and also to reduce the weight of the cabinet.

In the above-mentioned preferred embodiments, the contact portions 11 are integrally formed only on the plate member 10; however, the contact portions 11 may be integrally formed on the edge portion 20a of the plate member 20 as well, or the contact portions may be integrally formed on both of the plate members 10, 20.

Moreover, in the above-mentioned preferred embodiments, the aligned structure of the contact portions is placed along one edge portion of the plate shaped member; however, the contact portions maybe aligned on a plurality of edge portions.

INDUSTRIAL APPLICABILITY

The present invention is preferably utilized as an electromagnetic wave shielding technique for reducing adverse effects of electromagnetic waves that are exerted on the inside and the periphery of an apparatus in the field of electronic devices.

What is claimed is:

1. A cabinet structure of an electronic device comprising:

a pair of first and second plate members having edge portions that are butted against each other in a combined state as a cabinet, the edge portion of the first plate member being provided with a plurality of contact portions that contact the edge portion of the second plate member in the butted state in the length direction thereof;

wherein: the contact portions are formed by notches made in the edge portion of the first plate member so as to have a spring property, with a curved portion being formed on an idle end side thereof; and said plurality of contact portions are classified into at least the first group having the idle end directed toward the inside of the cabinet and a second group having the idle end directed toward the outside of the cabinet, with the contact portions belonging to the respective two groups being alternately formed on the edge portion of the first plate member along the length direction thereof, the contact portions belonging to the first group being placed at positions closer to the edge of the cabinet than the contact portions belonging to the second group.

2. The cabinet structure of an electronic device according to claim 1, wherein:

said plurality of contact portions respectively have the idle end sides directed inward, each idle end side being provided with a round, small protrusion that directly comes into contact with the edge portion of second plate member said, and is integrally formed thereon.

3. The cabinet structure of an electronic device according to claim 1, wherein: said plurality of contact portions respectively have the idle end sides directed inward, each idle end side having stiffening ribs integrally formed thereon through stamping.

* * * * *